United States Patent [19]
Tanigaki et al.

[11] Patent Number: 5,800,794
[45] Date of Patent: Sep. 1, 1998

[54] CLATHRATE COMPOUNDS AND PROCESSES FOR PRODUCTION THEREOF

[75] Inventors: Katsumi Tanigaki; Sadanori Kuroshima, both of Tokyo; Zhou Otto, Ibaraki, all of Japan

[73] Assignee: NEC Corporation, Tokyo, Japan

[21] Appl. No.: 774,425

[22] Filed: Dec. 30, 1996

[30] Foreign Application Priority Data

Dec. 28, 1995  [JP]  Japan .................................. 7-342101

[51] Int. Cl.$^6$ ........................... C01D 15/00; C01F 11/00; C01B 33/00
[52] U.S. Cl. ........................................................ 423/324
[58] Field of Search .................................. 423/324, 344; 420/556

[56] References Cited

PUBLICATIONS

Linus Pauling "General Chemistry" p. 65 (1948, no month) published by W H Freeman and Co., San Franisco California USA.

C. Cros et al., "Sur une Nouvelle Famille de Clathrates Minéraux Isotypes . . . Obtenus", *Journal of Solid State Chemistry*, vol. 2, 1970, pp. 570–581 no month.

S. Yamanaka et al., "Preparation of Barium–Containing Silicon Clathrate Compound", *Fullerene Science & Technology*, vol. 3, No. 1, 1995, pp. 21–28 no month.

S. Yamanaka et al., "Preparation of Barium–Containing Silicon Clathrate Compound," Fullerene Science & Technology, 3(1), 21–28 (1995) No month.

H. Kawaji et al., "Superconductivity in the Silicon Clathrate Compound $(Na,Ba)_xSi_{46}$," Physical Review Letters, vol. 74, No. 8, 20 Feb. 1995, pp. 1427–1429.

S. Yamanaka et al., "Preparation and superconductivity of Barium containing silicon clathrate compound, $(Ba,K)_xSi_{46}$," Eur. J. Solid State Inorg. Chem. 1995, pp. 799–807 No month, Tome 32, No. 7–8.

*Primary Examiner*—Gary P. Straub
*Assistant Examiner*—Timothy C. Vanoy
*Attorney, Agent, or Firm*—Sughrue, Mion, Zinn, Macpeak, & Seas, PLLC

[57] ABSTRACT

A silicon clathrate compound of the following composition:

$$(Li_4)_x Ae_6 Si_{46}$$

wherein $(Li_4)$ represents a $Li_4$ cluster; Ae is an alkaline earth metal element selected from the group consisting of Ba, Sr and Ca; and x is the number ratio of the $Li_4$ complex to the other elements and $0 < x \leq 2$, which contains, as the structural units of crystals, $Si_{46}$ clusters, each of which consists of $Si_{20}$ clusters and $Si_{24}$ clusters with cage structures formed by silicon atoms as the framework of the crystal and at least part of said $Si_{24}$ clusters encapsulate alkaline earth metal atoms inside the cage, and at least part of the $Si_{20}$ clusters encapsulate $Li_4$ inside the cage.

6 Claims, 2 Drawing Sheets

CLATHRATE COMPOUNDS AND PROCESSES FOR PRODUCTION THEREOF

BACKGROUND OF THE INVENTION

1. Field of the Invention

The present invention relates to clathrate compounds leading to semiconductors, metals, or insulators used in production of high-performance devices, as well as to the processes for production of such clathrate compounds.

2. Description of the Related Art

Currently, semiconductor devices (e.g. arithmetic and logic circuit devices, data storage devices and photoelectric conversion devices) for computer technology and lasers for optical communication technology are produced from silicon, germanium, a group III-V element compound semiconductor (e.g. GaAs), or a group II-VI element compound semiconductor (e.g. zinc sulfide).

The performances of these elements have heretofore been improved mainly by the advances of LSI fabrication techniques. In the future, however, the improvement of such device performance by lithographic techniques has a limitation and its further improvement is expected to be achieved mainly by the properties of the materials using in fabricating devices.

Accordingly, for further progress of electronics, it is warranted to develop a new material having properties greatly different from those of the materials conventionally used in electronic devices. As an approach to seek a breakthrough by such development of new materials, it is considered to use a clathrate compound having cluster features as the structural units of crystals.

In the cluster/clathrate materials, the bond between atoms constituting the substances is greatly different from that of conventional compounds, and it is possible to control the superconductivity and magnetism via resulting high-frequency phonon or the unique Fermi surfaces and also possible to alleviate the number of defects by making the cluster/clathrate structure as perfect as possible; as a result, the fundamental properties can ultimately be utilized.

As a cluster/clathrate material was first reported the clathrate compound having silicon or germanium (group IV element) atoms as the constituent of the framework structure; and it was found that, by appropriately selecting the preparation condition of such a substance, there can be obtained a silicon or germanium clathrate compound having cage-like structural units of unique shape with each encapsulating alkali metal atoms [for example, C. Cross et al., Journal of Solid State Chemistry 2, 570–581 (1970)].

In the silicon clathrate compound at the above stage, only an alkali metal atoms as either an element or a cluster are encapsulated in each $Si_{20}$ cluster (a cage structure formed by 20 silicon atoms) and each $Si_{24}$ cluster (a cage structure formed by 24 silicon atoms). The electronic properties of this silicon clathrate compound are mostly determined by the framework structure of the clathrate compound and have no variation to be widely used in many electronic fields; therefore, the silicon clathrate compound found no wide usage. For more than 20 years after the report of the above clathrate compound has not been applied in fabricating electronic devices.

Recently, however, it was reported that $Na_2Ba_6Si_{46}$ comprising $Si_{20}$ clusters each with an alkali metal atom (e.g. Na or K) encapsulated therein and $Si_{24}$ clusters each with a Ba (alkaline earth metal) atom encapsulated therein; hence the application of $Na_2Ba_6Si_{46}$ in the electronic field is expected [S. Yamanaka et al., Fullerene Science & Technology, 3(1), 21–28 (1995)].

The reason for the above expectation is that the silicon clathrate compound encapsulating an alkaline earth metal (Ba) atom in each of the $Si_{24}$ clusters can have greatly different electronic states by hybridization of the d-orbital of the alkaline earth metal atom with the levels for the valence band and conduction band of the $Si_{46}$ clathrate compound per se. In fact, while silicon clathrate compounds encapsulating no alkaline earth metal atom show no superconductivity, the silicon clathrate compound encapsulating Ba shows metallic properties and superconductivity. Superconductivity is not seen in conventional doped silicon crystals, and is unique to this particular clathrate compound. This is understood by the change in band structure, caused by the encapsulation of an alkaline earth metal atom inside the $Si_{24}$ cluster cage.

SUMMARY OF THE INVENTION

As is appreciated from the above-mentioned past studies on clathrate compounds, in order to develop a group IV metal clathrate compound with various electronic properties, widely usable in electronics, it was necessary that not only Ba but also other alkaline earth metals are encapsulated in a group IV metal clathrate compound in order to lead the resulting clathrate compounds to the materials with various intended properties.

As such a clathrate compound encapsulating alkaline earth metals, only known is a Ba-encapsulated silicon clathrate compound, $Na_6Ba_2Si_{46}$, and there is no report on the successful synthesis of any silicon clathrate compounds encapsulating the other alkaline earth metals. It has hitherto been thought impossible to develop a silicon or germanium clathrate compound encapsulating an alkaline earth metal, having various intended properties, or to appropriately select the starting materials for reactions so as to develop such clathrate compounds, using the conventional techniques.

Objects of the present invention are to provide silicon or germanium clathrate compounds with each comprising Si or Ge clusters encapsulating an alkaline earth metal other than Ba and alkali metals in case of need.

Other object of the present invention is to provide novel electronic materials with different electrical properties, by encapsulating appropriately selected metals inside the cluster cage of the above clathrate compounds.

The silicon or germanium clathrate compounds of the present invention capable of achieving the above objects include the followings:

a silicon clathrate compound of the following composition:

[wherein A is an alkali metal element selected from the group consisting of Na, K, Rb and Cs; Ae is an alkaline earth metal element selected from the group consisting of Sr and Ca; and x is the number ratio of the alkali metal element to other elements and $0 \leq x \leq 2$], which comprises, as a structural unit of crystals, $Si_{46}$ cluster with each consisting of $Si_{20}$ clusters and Si24 clusters having cage structures formed by silicon atoms of the framework of the crystal,
- at least a part of said $Si_{24}$ clusters encapsulating alkaline earth metal atoms inside the cage, and optionally at least a part of $Si_{20}$ clusters encapsulating alkali metal atoms inside the cage;

a silicon clathrate compound of the following composition:

$(Li_4)_2Ae_6Si_{46}$

[wherein Ae is an alkaline earth metal element selected from the group consisting of Ba, Sr and Ca], which comprises, as a structural unit of crystals, $Si_{46}$ cluster with each consisting of $Si_{20}$ clusters and $Si_{24}$ clusters having cage structures formed by silicon atoms of the framework of the crystal, at least a part of said $Si_{24}$ clusters encapsulating alkaline earth metal atoms inside the cage, and at least a part of $Si_{20}$ clusters encapsulating clustered $Li_4$ per $Si_{20}$ cluster;

a germanium clathrate compound of the following composition:

$A_xAe_6Ge_{46}$

[wherein A is an alkali metal element selected from the group consisting of Na, K, Rb and Cs; Ae is an alkaline earth metal element selected from the group consisting of Ba, Sr and Ca; and x is the number ratio of the alkali metal element to other elements and $0 \leq x \leq 2$], which comprises, as a structural unit of crystals, $Ge_{46}$ cluster with each consisting of $Ge_{20}$ clusters and $Ge_{24}$ clusters having cage structures formed by germanium atoms of the framework of the crystal, at least a part of said $Ge_{24}$ clusters encapsulating alkaline earth metal atoms inside the cage, and optionally at least a part of $Ge_{20}$ clusters encapsulating alkali metal atoms inside the cage, so as to provide said composition;

Each of the silicon or germanium clathrate compounds of the present invention has no crystal structure of the conventional $sp^3$ bond but has a crystal structure of the particular bond which is intermediate between $sp^3$ bond and $sp^2$ bond, because it has, as the minimum structural units of crystals, clusters with each having 20 silicon or germanium atoms and clusters with each having 24 silicon or germanium atoms.

The silicon clathrate compound $A_xAe_6Si_{46}$ of the present invention differs from the conventional silicon clathrate compound encapsulating a Ba atom in each $Si_{24}$ cluster unit, because the present compound encapsulates an alkaline earth metal atom other than Ba in each $Si_{24}$ cluster unit.

The present silicon clathrate compound $(Li_4)_2Ae_6Si_{46}$ encapsulating a lithium cluster consisting of four lithium atoms in each $Si_{20}$ cluster unit and encapsulating an alkaline earth metal atom in each $Si_{24}$ cluster unit, is different from the conventional silicon clathrate compound, because the present compound encapsulates a lithium cluster in each $Si_{20}$ cluster unit.

The present germanium clathrate compound $A_xAe_6Ge_{46}$ having germanium as the framework of the crystal and is different from the conventional silicon clathrate compound.

In the conventional techniques, it was thought that Ba is the only alkaline earth metal that can be encapsulated in the $Si_{24}$ clusters of silicon clathrate compound. In fact, there is no report of any kind concerning the successful synthesis of a silicon clathrate compound encapsulating an alkaline earth metal (e.g. Sr or Ca) other than Ba, also in the experimental level.

With respect to germanium clathrate compounds, no attempt has been made on the synthesis of any Ba-encapsulating clathrate compounds and, of course, no success has been reported.

Thus, as the clathrate compound which has the bonding mode above and can actually be synthesized only known has been $A_xBa_6Si_{46}$ using Si as the framework element.

In the conventional techniques, only a silicon clathrate compound encapsulating Ba as an alkaline earth metal was synthesized. The reason is thought to be as follows.

$A_2Ba_6Si_{46}$ (A is Na or K) has been synthesized by a conventional process by preparing a ASi-BaSi$_2$ solid solution (e.g. $A_2BaSi_4$) having $Si_4$ clusters as the basic structure, from two types of starting materials, ASi and BaSi, beng followed by an alkali-removing treatment of the solid solution with heating in vacuum to change the crystal structure into the clathrate [S. Yamanaka et al., Fullerene Science & Technology, 3 (1), 21–28 (1995)].

The reason why, in the above, only Ba was encapsulated as an alkaline earth metal and neither Sr nor Ca was investigated, is that only $BaSi_2$, similarly to ASi, has a cubic crystal structure containing tetrahedral $Si_4$ clusters with each having the cage structure of four silicon atoms and thus a solid solution (a precursor to the clathrate compound) having $Si_4$ clusters as the important structural units can be also easily obtained from the two materials, $BaSi_2$ and ASi.

Meanwhile, $SrSi_2$, although having a cubic crystal structure, contains no $Si_4$ cluster which is considered to be necessary for the formation of the $Si_{46}$ clathrate; and $CaSi_2$ has a layered crystal structure. Thus, the structure of $SrSi_2$ and $CaSi_2$ are greatly different from that of $BaSi_2$ containing $Si_4$ clusters.

As mentioned above, among the alkaline earth metals, only Ba was investigated and there is no report on the successful synthesis of any silicon clathrate compound encapsulating Sr or Ca.

The study by the present inventors, however, newly found out that, contrary to the anticipation based on the conventional techniques, a ternary solid solution $A_2AeSi_4$ containing $Si_4$ clusters can be prepared even when Ae is Sr or Ca, if the condition is well defined.

That is, the present inventors found out that a solid solution $A_2AeSi_4$ produced from ASi and $SrSi_2$ or $CaSi_2$, although having a lattice constant different from that of ASi, has structure containing the same $Si_4$ clusters as that possessed by ASi. Using the above silicon solid solution $A_2AeSi_4$ (containing an alkali metal and an alkaline earth metal) as a precursor, the present inventors succeeded in the synthesis of a novel clathrate compound $A_xAe_6Si_{46}$ of the present invention.

The synthesis of Ge clathrate compound was thought to be impossible as well according to the general knowledge on clathrate compounds, using the conventional techniques.

It was thought that, in the conventional techniques, Si (a Group IV element) is relatively similar to carbon (C) (also a Group IV element) and may partially have a $sp^2$ hybrid orbital (which is the typical graphite structure), in addition to the $sp^3$ diamond structure and, therefore, use of Si, if it being compared with use of other Group IV metal elements, may make it relatively easy to synthesize a clathrate compound for which the coexistence of $sp^3$ forhybrid orbital and $sp^2$ hybrid orbital is necessary.

It was also known that the $sp^2$ hybrid orbital becomes more unstable in the Group IV element from the direction of from C to Si and further to Ge. In fact, materials constituted by a single type of element and having a $sp^2$ network as the framework only exist in the case of C (benzene and graphite are examples of such a substance), but no such substance exists more in the case of Ge.

Thus, it was thought within the general knowledge based on the conventional techniques that when Ge is used, in place of Si, as the framework element the change from Si to Ge in clathrate compound will be very difficult. In fact, there is no report on the successful synthesis of any Ge clathrate compound encapsulating alkaline earth metals.

The present inventors newly found out that even when Ge is used, a germanium clathrate compound $A_xAe_6Ge_{46}$ can be synthesized by synthesizing a Ge—A—Ae ternary solid solution having $Ge_4$ cluster as the basic structural unit and then being followed by an alkali removing treatment. The present invention has been completed based on this finding.

That is, although a binary substance $AeGe_2$ consisting of Ge and Ae (Ba, Sr or Ca) has a different structure depending upon the kind of Ae used, mixing of the $AeGe_2$ with GeA (A is Na, K, Rb or Cs) at a particular molar ratio ($AGe/AeGe_2$ = 2/1) can form a ternary solid solution of $A_2AeGe_4$ having a $Ge_4$ cluster as the basic structural unit similarly to AGe. Since this Ge clathrate compound has a feature that it has a tetrahederal clusters $Ge_4$ structure constituted by Ge atoms, by subjecting the ternary solid solution compound to an alkali-removing treatment, a novel germanium clathrate compound $A_xAe_6Ge_{46}$ of the present invention can be obtained.

There is no report, either, on any silicon $Si_{46}$ clathrate compound encapsulating a $Li_4$ cluster inside the $Si_{20}$ cluster cages. Therefore, a silicon clathrate compound $(Li_4)_2Ae_6Si_{46}$ of the present invention is also a novel compound.

According to the present invention, Group IV metal clathrate compounds with cage structure encapsulating at least alkali earth metal atoms inside the cages can be synthesized using Si or Ge (which exists abundantly on the earth), an alkaline earth metal and, in case of necessity, an alkali metal (these metals also exist abundantly and pose little public hazard problem).

These clathrate compounds have a basic structure greatly different from conventional Si and Ge crystals and have various properties of insulator, semiconductors of widend band gaps, metals or superconductors, depending upon the kind(s) of the metal(s) encapsulated in the cluster cages; and are very useful as materials for fabricating various electronic devices. The fact that various properties can be obtained using one basic clathrate structure, enables easy production of desired electronic devices at a low cost, and therefore has a big significance in industry.

Further, the band structure of narrow dispersion is very unique in the present clathrate compounds, as compared with that in conventional semiconductors, may show large changes in magnetism and electrical conductivity, upon external influences and, therefore, may be effectively utilized under small magnetic fields such as sensor, magnetic resistance devices and the like.

DETAILED DESCRIPTION OF THE INVENTION AND PREFERRED EMBODIMENTS

Figure 1:
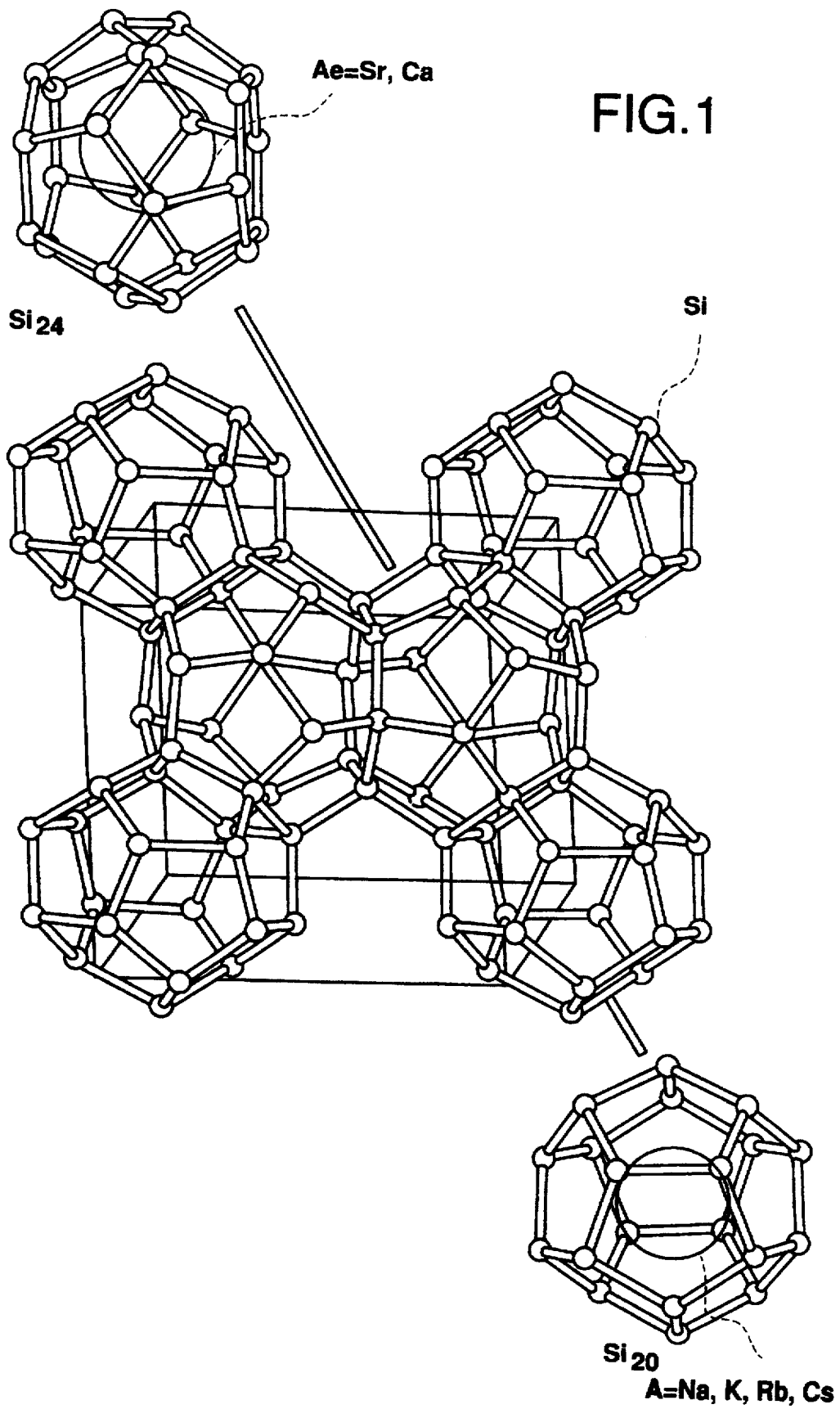
FIG. 1 is a schematic drawing showing the structure of a $Si_{46}$ cluster which is the crystal structural unit of a silicon clathrate compound of the present invention.
Figure 2:
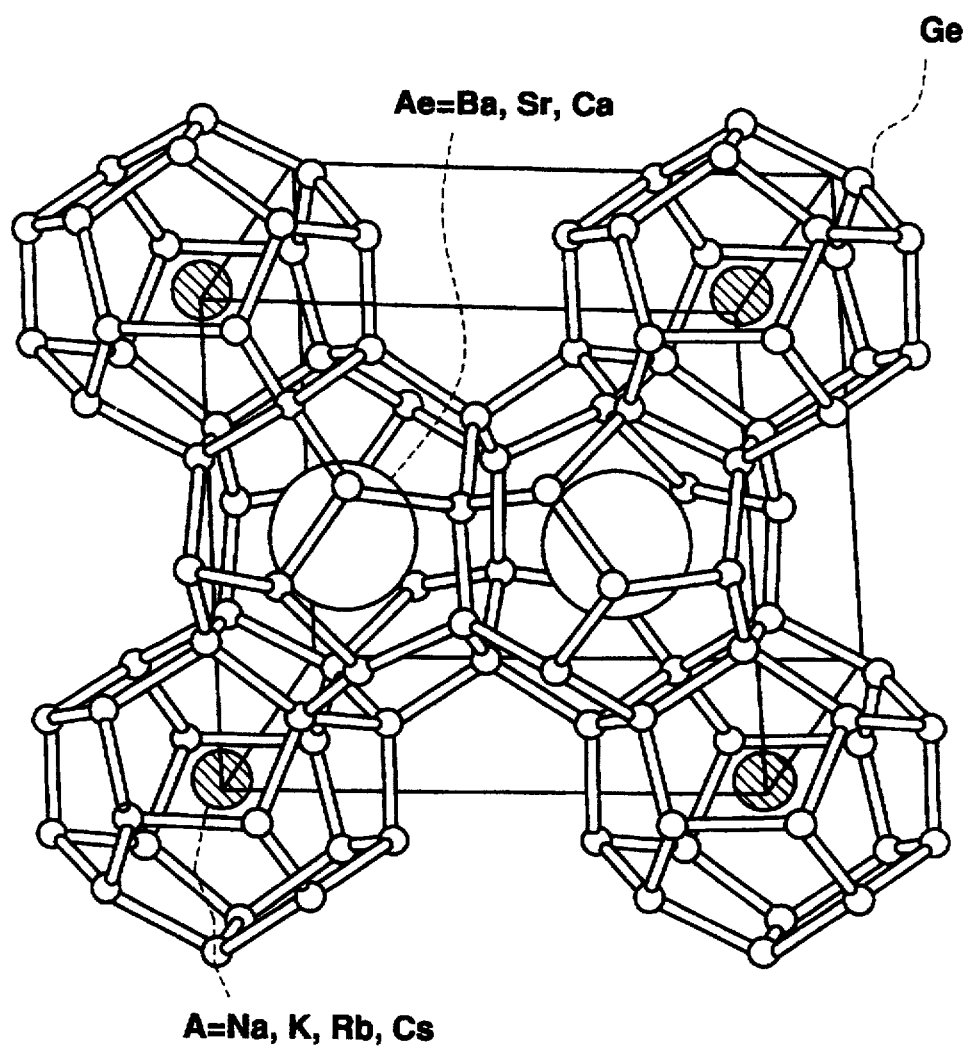
FIG. 2 is a schematic drawing showing the structure of a $Ge_{46}$ cluster which is the crystal structural unit of a germanium clathrate compound of the present invention.

The Group IV metal clathrate compounds of the present invention have a basic crystal structure composed of $Me_{46}$ clusters (Me is Si or Ge) each consisting of (1) $Me_{20}$ clusters of a dodecahedral cage of 20 silicon or germanium atoms and (2) $Me_{24}$ clusters with each having a tetradecahedral cage of 24 silicon or germanium atoms.

The first embodiment of the silicon clathrate compounds of the present invention has, as mentioned previously, the composition represented by the following formula:

wherein A is Na, K, Rb or Cs; Ae is Sr or Ca; and x is a real number of 0 to 2 and indicates the atom number ratio of A to other elements.

When the above compound contains an alkali metal (A), the alkali metal atom is encapsulated in part or all of the $Si_{20}$ clusters.

Therefore, the silicon clathrate compound of the first embodiment has the following three cases.

I. No alkali metal atom is encapsulated in any $Si_{20}$ cluster.

II. There are two kinds of $Si_{20}$ clusters, one kind of $Si_{20}$ cluster(s) with each encapsulating alkali metal atoms and the other one(s) with each encapsulating no alkali metal atom.

III. Each of the $Si_{20}$ clusters encapsulates alkali metal atom(s).

Incidentally, when the alkali metal is Li, part or all of the $Si_{20}$ clusters can encapsulate a cluster composed of more than one Li atom, for example, a cluster composed of 4 Li atoms. When the alkali metal is other than Li, one alkali metal atom is generally encapsulated in one $Si_{20}$ cluster.

This is presumed to be because a Li atom has a significantly small ionic radius (0.78 Å) as compared with those of other alkali metal atoms and each $Si_{20}$ cluster can provide an enough space for encapsulating some members of Li atoms. $Li_4$ is the most stable cluster in Li.

Hence, the second embodiment of the silicon clathrate compounds of the present invention has, as mentioned previously, the composition represented by the following formula:

wherein Ae is Ba, Sr or Ca.

The germanium clathrate compound of the present invention has, as mentioned previously, the composition represented by the following formula:

wherein A is an alkali metal; Ae is Ba, Sr or Ca; and x is a real number of 0 to 2 and indicates the atom number ratio of A to the other elements. This germanium clathrate compound, similarly to the silicon clathrate compound of the first embodiment, has the following cases.

I. No alkali metal atom is encapsulated in any $Ge_{20}$ cluster.

II. There are two kinds of $Ge_{20}$ clusters; one kind of $Ge_{20}$ cluster(s) with each encapsulating an alkali metal atom(s) and the other one(s) with each encapsulating no alkali metal atom.

III. Each of the $Ge_{20}$ clusters encapsulates alkali metal atom(s).

In the above-mentioned clathrate compounds of the present invention, the alkaline earth metal is encapsulated in the $Me_{24}$ clusters (Me is Si or Ge).

The clathrate compounds of the present invention can be produced, for example, by the following processes.

A. Processes for Production of Silicon Clathrate Compounds

First, an alkali metal (A) and Si are mixed, and the mixture is placed in a PBN or a tungsten container. The tube is sealed in a stainless steel tube and heated under inert gas atomosphere like Ar at 500°–650° C. to obtain an ASi compound. The heating can preferably be conducted by the use of, for example, an electric furnace.

Next, an alkaline earth metal (Ae) and Si are mixed, and the mixture is heated to about 900°–1,200° C. in an atmosphere of an inert gas, for example, argon to synthesize an $AeSi_2$ compound. The heating can preferably be conducted by the use of, for example, high-frequency induction heating.

The above-obtained ASi compound and AeSi$_2$ compound are mixed at a stoichiometric ratio of 2:1 and heated at about 600° C. to synthesize a ternary solid solution A$_2$AeSi$_4$.

Finally, the ternary solid solution is heat-treated by controlling pressure with an inert gas under vacuum (20–200 Torr) in a heating furnace whose temperature can be controlled to 300°–600° C. very accurately, and is then subjected to distillation of alkali metals, whereby a desired silicon clathrate compound can be formed.

Resulting products during the reaction can be easily removed from the above-obtained product, because BaSi$_2$, etc. produced as by-products are water-soluble and easily removable by a treatment with an acidic aqueous solution, and a desired silicon clathrate compound can be isolated in a pure form.

The number ratio (x) of the alkali metal can be controlled by selecting an appropriate conditions.

The alkali metal can be Na, K, Rb or Cs; and the alkaline earth metal can be Sr or Ca.

In the above production process, the ternary solid solution A$_2$AeSi$_4$ obtained as an intermediate from ASi (having Si$_4$ clusters as the basic structural unit) and SrSi$_2$ or CaSi$_2$ (these two compounds have no Si$_4$ clusters unlike BaSi$_2$), have Si$_4$ clusters as the basic structural unit; therefore, heat treatment with accurate control of the ternary solid solution can produce an intended silicon clathrate compound containing Sr or Ca.

In the course of the study of the present invention, the present inventors found out that when Li is used as an alkali metal, a silicon clathrate compound (Li$_4$)$_2$Ae$_6$Si$_{46}$ (Ae is Ba, Sr or Ca) can be obtained, which encapsulates Li in the form of a Li$_4$ cluster in the Si$_{20}$ clusters. The existence of such a silicon clathrate compound is possible because the ionic radius (0.78 Å) of Li atom is significantly small as compared with those of other alkali metals and therefore each Si$_{20}$ cluster has an inert space sufficiently large to encapsulate a stable Li$_4$ cluster therein.

In this case, the alkaline earth metal (Ae) used in the production of the above (Li$_4$)$_2$Ae$_6$Si$_{46}$ can be Ba, Sr or Ca.

The silicon clathrate compounds with a unique bonding nature of the present invention, unlike conventional Si crystals having a diamond structure, show a band structure of essentially narrow dispersion owing to the existing cluster units in the silicon clathrate compounds. The band is further greatly changed when an alkaline earth metal is encapsulated in the silicon clathrate compounds, because there takes place hybridization between the d-orbital of the alkaline earth metal and the band of the silicon clathrate framework. Therefore, the band of the silicon clathrate compound can be greatly modified by appropriately selecting the alkaline earth metal used.

Thus, the silicon clathrate compounds of the present invention, unlike conventional Si crystals, can have a variety of properties ranging from insulator, semiconductors of different band gaps, metal to superconductor, by selecting the type as well as the amount of the alkaline earth metal encapsulated. This suggests a possibility that a semiconductor device with high performance can be produced using silicon, alkali metals and alkaline earth metals, all of which exist in rich natural abundance and pose little public pollution problem.

Further, the silicon clathrate compounds of the present invention, having a band with narrow dispersion characteristics, show a large property change against external influences; that is, they can exhibit a sensing function of magnetic field, which is not available in clathrate compounds previously reported and an unexpectedly much larger change in conductivity than in conventional materials, for example, a giant magneto resistance will be achieved.

B. Process for Production of Germanium Clathrate Compound

First, an alkali metal (A) and Ge are mixed, and the mixture is placed in a PBN or a tungsten container. The tube is sealed in a stainless steel tube and heated under inert gas atomosphere at 500°–650° C. to obtain an AGe compound. The heating can preferably be conducted by the use of an inert gas, for example, an electric furnace.

Next, an alkaline earth metal (Ae) and Ge are mixed, and the mixture is heated to about 900°–1,200° C. in an atmosphere of an inert gas, for example, argon to synthesize an AeGe$_2$ compound. The heating can preferably be conducted by the use of, for example, highfrequency induction method.

The above-obtained AGe compound and AeGe$_2$ compound are mixed with a stoichiometric ratio of 2:1 and heated at about 600° C. to synthesize a ternary solid solution A$_2$AeGe$_4$.

Finally, the ternary solid solution is heat-treated in an inert gas atmosphere under vacuum (20–200 Torr) with a control of pressure by introducing insert gasses using a heating furnace whose temperature can be controlled to 300°–600° C. very accurately, and is subjected to distillation of alkali metals, whereby a desired germanium clathrate compound can be synthesized.

Resulting products can be easily removed from the above-obtained product, because BaGe$_2$, etc. produced as by-products are water-soluble and easily removable by a treatment with an acidic aqueous solution, and a desired germanium clathrate compound can be isolated in a pure form. The atom number ratio (x) of the alkali metal may be controlled with an accurate distillation conditions.

The alkali metal can be Na, K, Rb or Cs; and the alkaline earth metal can be Ba, Sr or Ca.

In the above production process as well, the ternary solid solution A$_2$AeGe$_4$ obtained as an intermediate from AGe (having Si$_4$ clusters as the basic structural units) and AeGe$_2$ (generally having no Si$_4$ clusters unlike BaSi$_2$), have Si$_4$ clusters as the basic structural unit; therefore, an intended germanium clathrate compound containing Ba, Sr or Ca can be produced by controlling heat treatment of the ternary solid solution.

The germanium clathrate compounds, unlike conventional Ge crystals having a diamond structure, show a band with essentially narrow dispersion (similar to that shown by the above-mentioned silicon clathrate compounds) owing to the cluster units existing in the germanium clathrate compounds. The band is greatly changed when an alkaline earth metal is encapsulated in the germanium compound, because hybridization take place between the d-orbital of alkaline earth metal and the band of the framework of the germanium clathrate compound. Therefore, the band of germanium clathrate compound can be greatly modified by appropriately selecting the alkaline earth metal used.

Thus, the germanium clathrate compounds of the present invention, unlike conventional Ge crystals, can have a variety of properties ranging from insulator, semiconductors with different band gaps, metal to superconductor, by appropriately selecting the type and the amount of the alkaline earth metal encapsulated. This suggests a possibility that a semiconductor device with high performance can be produced using germanium, alkali metals and alkaline earth metals, all of which exist in rich natural abundance on the earth and pose little public hazard and pollution problem.

Further, the germanium clathrate compounds of the present invention, having a band with narrow dispersion, show a large property change against external influences; that is, they can exhibit a sensing function not possessed in conventional clathrate compounds reported as far and larger giant magneto resistance than in conventional materials.

The present invention is hereinafter described in more detail by way of Examples.

Example 1

A 1:1 mixture of Na (230 mg) and Si (281 mg) was placed in a PBN container. The PBN was sealed in a stainless steel tube in an argon atmosphere and heated at 650° C. for 5 hours to give rise to a reaction. The reaction system was cooled down to room temperature and the reaction product (NaSi) was taken out. The crystal form of the compound was examined by X-ray analyses, which showed a monoclinic crystal system (space group: C2/C).

A 1:2 mixture of Sr (440 mg) and Si (281 mg) was heated in an argon atmosphere by high-frequency induction heating at 30A (temperature: about 1,200° C.) for 10 minutes to give rise to a reaction. The reaction system was cooled down to room temperature, and the reaction product ($SrSi_2$) was yielded. The crystal form of the compound was examined by X-ray analysis, which showed a cubic crystal system (space group: $32P4_3$).

The above-obtained two compounds, NaSi and $SrSi_2$, were mixed at a molar ratio of 2:1 and placed in a PBN container. The PBN was sealed in a stainless steel tube in an argon atmosphere and heated at 650° C. for 48 hours to give rise to a reaction. The reaction system was cooled to room temperature and the reaction product was taken out. The product was a uniform solid solution with a composition of $Na_2SrSi_4$, having a crystal structure similar to that of NaSi, i.e. $Si_4$ clusters exist as the basic structural unit of crystals.

The solid solution was heated at 400° C. for 150 hours under vacuum of 20 Torr, whereby an intended clathrate compound with a composition of $Na_2Sr_6Si_{46}$ was synthesized.

The reaction system was cooled to room temperature; and the reaction product was taken out, washed with 0.1N hydrochloric acid and water in this order, and dried to obtain a purified product. The purified product was subjected to elemental analysis, which indicated $Na_{1.8}Sr_{6.1}Si_{46}$.

The purified product was also subjected to X-ray analysis, which confirmed that the product was a clathrate compound showing an intended crystal structure. The properties of the compound were measured and found to be metallic and superconducting with a critical temperature of 4K.

Example 2

A 1:1 mixture of K (696 mg) and Si (500 mg) was placed in a PBN container. The PBN was sealed in a stainless steel tube in an argon atmosphere and heated at 650° C. for 5 hours to give rise to a reaction. The reaction system was cooled to room temperature and the reaction product (KSi) was taken out. The crystal form of the compound was examined by X-ray analysis, which showed a cubic crystal system [space group: P-4 (axis of four rotary inversions) 3n].

The above- obtained KSi compound and the $SrSi_2$ synthesized in Example 1 were mixed at a molar ratio of 2:1 and placed in a PBN cell. The PBN was sealed in a stainless steel tube in an argon atmosphere and heated at 650° C. for 48 hours to give rise to a reaction. The reaction system was cooled to room temperature and the reaction product was taken out. The product was a uniform solid solution with a composition of $K_2SrSi_4$, having a crystal structure similar to those of NaSi and KSi.

The solid solution was heated at 370° C. for 120 hours under vacuum of 50 Torr, whereby an intended clathrate compound having a composition of $K_2Sr_6Si_{46}$ was synthesized.

The reaction system was cooled down to room temperature; and the reaction product was taken out, washed with 0.1N hydrochloric acid and water in this order, and dried to obtain a purified product. The purified product was subjected to elemental analysis, which indicated $K_{1.9}Sr_{6.2}Si_{46}$.

The purified product was also subjected to X-ray analysis, which confirmed that the product was a clathrate compound having an intended crystal structure. The properties of the compound were measured and found to be metallic and superconducting with a critical temperature of 3.5K.

Example 3

A 1:2 mixture of Ca (201 mg) and Si (281 mg) was heated in an argon atmosphere by high-frequency induction heating at 30A (temperature: about 1,200° C.) for 10 minutes to give rise to a reaction. The reaction system was cooled to room temperature, and the reaction product ($CaSi_2$) was taken out. The crystal structure of the compound was examined by X-ray analysis, which showed a trigonal crystal system [space group: R-3 (axis of three rotary inversions) m].

The above-obtained $CaSi_2$ compound and the NaSi synthesized in Example 1 were mixed at a molar ratio of 1:2 and placed in a PBN cell. The PBN was sealed in a stainless steel tube in an argon atmosphere and heated at 650° C. for 48 hours to give rise to a reaction. The reaction system was cooled to room temperature and the reaction product was taken out. The product was a uniform solid solution with a composition of $Na_2CaSi_4$, having a crystal structure similar to that of NaSi. This solid solution showed a crystal structure similar to that of NaSi (although the lattice was expanded) but greatly different from that of $CaSi_2$. The solid solution was heated at 400° C. for 100 hours under vacuum of 50 Torr by refilling argon, whereby an intended clathrate compound having a composition of $Na_2Ca_6Si_{46}$ was synthesized.

The reaction system was cooled to room temperature; and the reaction product was taken out, washed with 0.1N hydrochloric acid and water in this order, and dried to obtain a purified product. The purified product was subjected to elemental analysis, which indicated $Na_{1.9}Ca_{6.1}Si_{46}$. The purified product was examined for electrical conductivity by an ordinary method and found to be a semiconductor having a relatively small band gap (about 0.2 eV).

Example 4

A 1:1 mixture of Li (70 mg) and Si (280 mg) were placed in a PBN container. The PBN tube was sealed in a stainless steel tube in an argon atmosphere. The stainless steel tube was heated in an electric furnace at 650° C. for 10 hours to give rise to a reaction to obtain a LiSi compound. The reaction system was cooled to room temperature, and the reaction product was taken out. The product was examined for crystal form by X-ray analysis, which confirmed that it had an incomplete crystal structure but relatively similar to that of NaSi.

A 1:2 mixture of Ba (687 mg) and Si (281 mg) was heated in an argon atmosphere in a furnace of high-frequency induction heating type at 30A (temperature: about 1,200° C., for 10 minutes to give rise to a reaction. The reaction system was cooled to room temperature, and the reaction product ($BaSi_2$) was taken out. The crystal structure of the compound was examined by X-ray analysis, which showed an orthorhombic crystal system (space group: Pnma).

The above-obtained two compounds, LiSi and BaSi$_2$, were mixed at a molar ratio of 2:1. Thereinto was mixed Li at a molar ratio of 3, to obtain a 2:1:3 (molar ratio) mixture of LiSi, BaSi$_2$ and Li. The mixture was heated at 650° C. for 48 hours in an argon atmosphere to synthesize a solid solution having Si$_4$ clusters.

The solid solution was heated at 400° C. for 48 hours under vacuum of 20 Torr, whereby a clathrate compound having a composition of (Li$_4$)$_2$Ba$_6$Si$_{46}$ was synthesized.

The reaction system was cooled to room temperature; and the reaction product was taken out, washed with 0.1N hydrochloric acid and water in this order, and dried to obtain a purified product. The purified product was subjected to measurement of electrical conductivity with an standard method. As a result, the product was a metal but showed no superconductivity down to 2K.

Example 5

A 1:1 mixture of Na (230 mg) and Ge (726 mg) was placed in a PBN cell. The PBN was sealed in a stainless steel tube in an argon atmosphere and heated at 650° C. for 5 hours to give rise to a reaction. The reaction system was cooled to room temperature and the reaction product (NaGe) was taken out. The crystal structure of the compound was examined by X-ray analysis, which showed a crystal of space group=mP32.

A 1:2 mixture of Ba (1,374 mg) and Ge (1,452 mg) was heated in an argon atmosphere by high-frequency induction heating at 30A (temperature: about 1,200° C. for 10 minutes to give rise to a reaction. The reaction system was cooled to room temperature, and the reaction product (BaGe$_2$) was taken out. The crystal form of the compound was examined by X-ray analysis, which showed a crystal of space group=oP12.

The above-obtained-two compounds, NaGe and BaGe$_2$, were mixed at a molar ratio of 2:1 and placed in a PBN cell. The PBN was sealed in a stainless steel tube in an argon atmosphere and heated at 650° C. for 48 hours to give rise to a reaction. The reaction system was cooled to room temperature and the reaction product was taken out. The product was a uniform solid solution with a composition of Na$_2$BaGe$_4$, having a crystal structure similar to that of NaGe.

The solid solution was heated at 400° C. for 200 hours under vacuum of 20 Torr, whereby an intended clathrate compound with a composition of Na$_2$Ba$_6$Ge$_{46}$ was synthesized.

The reaction system was cooled to room temperature; and the reaction product was taken out, washed with 0.1N hydrochloric acid and water in this order, and dried to obtain a purified product. The purified product was subjected to elemental analysis, which indicated Na$_{1.6}$Ba$_{6.2}$Ge$_{46}$. The purified product was also subjected to X-ray analysis, which confirmed that the product was a germanium clathrate compound having an intended crystal structure. The properties of the compound were measured and found to be a metal with an electrical conductivity of 550 Scm$^{-1}$.

Example 6

A 1:1 mixture of K (391 mg) and Ge (726 mg) was placed in a PBN cell. The PBN was sealed in a stainless steel tube in an argon atmosphere and heated at 650° C. for 5 hours to give rise to a reaction. The reaction system was cooled to room temperature and the reaction product (KGe) was taken out. The crystal structure of the compound was examined by X-ray analysis, which showed a crystal of space group=cP64.

The above-obtained KGe and the BaGe$_2$ obtained in Example 5 were mixed at a molar ratio of 2:1 and placed in a PBN cell. The PBN was sealed in a stainless steel tube in an argon atmosphere and heated at 650° C. for 48 hours to give rise to a reaction. The reaction system was cooled to room temperature and the reaction product was taken out. The product was a uniform solid solution with a composition of K$_2$BaGe$_4$, showing a crystal structure similar to that of KGe.

The solid solution was heated at 370° C. for 200 hours under vacuum of 50 Torr, whereby an intended clathrate compound having a composition of K$_2$Ba$_6$Ge$_{46}$ was synthesized.

The reaction system was cooled to room temperature; and the reaction product was taken out, washed with 0.1N hydrochloric acid and water in this order, and dried to obtain a purified product. The purified product was subjected to elemental analysis, which indicated K$_{1.9}$Ba$_{6.2}$Ge$_{46}$. The purified product was also subjected to X-ray analysis, which confirmed that the product was a germanium clathrate compound having an intended crystal structure. The properties of the compound were measured and found to be a metal with an electrical conductivity of 500 Scm$^{-1}$.

Example 7

A 1:2 mixture of Ca (400 mg) and Ge (1,452 mg) was heated in an argon atmosphere by high-frequency induction heating at 30A (temperature: about 1,200° C., for 10 minutes to give rise to a reaction. The reaction system was cooled to room temperature, and the reaction product (CaGe$_2$) was taken out. The crystal form of the compound was examined by X-ray analysis, which showed a crystal of space group=hR6.

The above-obtained CaGe$_2$ and the NaGe obtained in Example 5 were mixed at a molar ratio of 1:2 and placed in a PBN cell. The PBN was sealed in a stainless steel tube in an argon atmosphere and heated at 650° C. for 48 hours to give rise to a reaction. The reaction system was cooled to room temperature and the reaction product was taken out. The product was a uniform solid solution with a composition of Na$_2$CaGe$_4$, having a crystal structure similar to that of NaGe (except for the expanded lattice) but greatly different from that of CaGe$_2$.

The solid solution was heated at 400° C. for 150 hours under vacuum of 50 Torr, whereby an intended clathrate compound with a composition of Na$_2$Ca$_6$Ge$_{46}$ was synthesized.

The reaction system was cooled down to room temperature, and the reaction product was taken out, washed with 0.1N hydrochloric acid and water in this order, and dried to obtain a purified product. The purified product was subjected to elemental analysis, which indicated Na$_{1.9}$Ca$_{6.1}$Ge$_{46}$. The purified product was also subjected to X-ray analysis, which confirmed that the product was a germanium clathrate compound having an intended crystal structure. The compound was measured for electrical conductivity, which showed that it is a semiconductor with a relatively small band gap (about 0.2 eV).

Example 8

A 1:2 mixture of Sr (876 mg) and Ge (1,450 mg) was heated in an argon atmosphere with a high-frequency induction method at 30A (temperature: about 1,200° C.) for 10 minutes hours to give rise to a reaction. The reaction system was cooled to room temperature, and the reaction product (SrGe$_2$) was taken out. The crystal form of the compound was examined by X-ray analysis, which showed a crystal of space group=oP12.

The above-obtained SrGe$_2$ and the NaGe obtained in Example 5 were mixed at a molar ratio of 1:2 and placed in a PBN cell. The PBN was sealed in a stainless steel tube in an argon atmosphere and heated at 650° C. for 48 hours to give rise to a reaction. The reaction system was cooled to room temperature and the reaction product was taken out. The product was a uniform solid solution with a composition of Na$_2$SrGe$_4$, having a crystal structure similar to that of NaGe (except for the expanded lattice) but different from that of SrGe$_2$.

The solid solution was heated at 420° C. for 150 hours under vacuum of 50 Torr, whereby an intended clathrate compound having a composition of Na$_2$Sr$_6$Ge$_{46}$ was synthesized.

The reaction system was cooled to room temperature; and the reaction product was taken out, washed with 0.1N hydrochloric acid and water in this order, and dried to obtain a purified product. The purified product was subjected to elemental analysis, which indicated Na$_{1.5}$Sr$_{6.3}$Ge$_{46}$. The purified product was also subjected to X-ray analysis, which confirmed that the product was a germanium clathrate compound having an intended crystal structure. The properties of the compound were measured and found to be a semiconductor with a relatively small band gap (about 0.1 eV).

What is claimed is:

1. A silicon clathrate compound of the following composition:

$$(Li_4)_xAe_6Si_{46}$$

wherein (Li$_4$) represents a Li$_4$ cluster; Ae is an alkaline earth metal element selected from the group consisting of Ba, Sr and Ca; and x is the number ratio of the Li$_4$ complex to the other elements and $0<x\leq2$, which comprises, as the structural unit of crystals, Si$_{46}$ clusters, each of which consists of Si$_{20}$ clusters and Si$_{24}$ clusters with cage structures formed by silicon atoms as the framework of the crystal, at least a part of said Si$_{24}$ clusters encapsulate alkaline earth metals atoms inside the cage, and at least a part of Si$_{20}$ clusters encapsulate, clustered Li$_4$ inside the cage.

2. The clathrate compound according to claim 1, wherein x=2.

3. The clathrate compound according to claim 1, wherein x<2.

4. The clathrate compound according to claim 1, wherein the alkaline earth element is Ba.

5. The clathrate compound according to claim 1, wherein the alkaline earth metal is Sr.

6. The clathrate compound according to claim 1, wherein the alkaline earth metal is Ca.

* * * * *